United States Patent
Chiu et al.

(10) Patent No.: US 8,007,694 B2
(45) Date of Patent: Aug. 30, 2011

(54) P-TYPE METAL OXIDE SEMICONDUCTOR MATERIAL AND FABRICATION METHOD THEREOF

(75) Inventors: Kuo-Chuang Chiu, Hsinchu (TW); Yi-Wen Kao, Banqiao (TW); Shan-Haw Chiou, Baoshan Shiang (TW)

(73) Assignee: Industrial Technology Research Institute (TW)

( * ) Notice: Subject to any disclaimer, the term of this patent is extended or adjusted under 35 U.S.C. 154(b) by 84 days.

(21) Appl. No.: 12/431,408

(22) Filed: Apr. 28, 2009

(65) Prior Publication Data

US 2010/0148133 A1 Jun. 17, 2010

(30) Foreign Application Priority Data

Dec. 16, 2008 (TW) .............................. 97148889 A

(51) Int. Cl.
*H01B 1/08* (2006.01)
*H01B 1/12* (2006.01)
(52) U.S. Cl. ................. 252/519.51; 252/519.1
(58) Field of Classification Search ............. 252/519.51, 252/519.1
See application file for complete search history.

(56) References Cited

U.S. PATENT DOCUMENTS 6,420,742 B1 * 7/2002 Ahn et al. ................. 257/295
2005/0130844 A1 * 6/2005 Iwata ........................ 505/193

FOREIGN PATENT DOCUMENTS

CN 101320814 A * 12/2008

OTHER PUBLICATIONS

Kuo-Chuang Chiu et al., "Fabrication of p-Type Li-Doped ZnO Films by RF Magnetron Sputtering", J. Am. Ceram. Soc., 93(7), 1860-1862 (2010).*
English translation of CN 101320814 A, Dec. 10, 2008.*
Xie Xinghua et al., "Synthesis of Lithium and Zinc Oxide Nanoagglomerations", Rare Metal Materials and Engineering, 35 (Supp. 2), 355-358 (Aug. 2006).*

* cited by examiner

*Primary Examiner* — Douglas Mc Ginty
(74) *Attorney, Agent, or Firm* — Lowe Hauptman Ham & Berner, LLP

(57) ABSTRACT

A fabrication method for a p-type metal oxide semiconductor material is disclosed, including providing a lithium salt and a zinc salt to be mixed in a solution, wherein to the solution is added a chelating agent to form a metal complex compound comprising lithium and zinc. A heating process for the metal complex compound to form a p-type metal oxide semiconductor material powder is performed, having a formula $Li_x Zn_{x-1} O$.

6 Claims, 3 Drawing Sheets

P-TYPE METAL OXIDE SEMICONDUCTOR MATERIAL AND FABRICATION METHOD THEREOF

CROSS REFERENCE TO RELATED APPLICATIONS

This application claims priority of Taiwan Patent Application No. 97148889, filed on Dec. 16, 2008, the entirety of which is incorporated by reference herein.

BACKGROUND OF THE INVENTION

1. Field of the Invention

The invention relates to a p-type metal oxide semiconductor material, and more particularly related to a zinc oxide semiconductor material.

2. Description of the Related Art

Zinc oxide based semiconductor material is noted for being capable of emitting blue light and near ultraviolet light with wavelength below 400 nm due to wide band gap. The semiconductor material is used for light emitting devices, light-receiving devices, piezoelectric devices, transparent conductive electrodes and active devices. Specifically, transparent conductive electrodes including zinc oxide based semiconductor material is widely used in many photoelectric and semiconductor devices. Development of zinc oxide based n-type semiconductor materials have been disclosed, but development of zinc oxide based p-type semiconductor materials have not been successfully obtained, as the zinc oxide based p-type semiconductor materials have unstable characteristics and bad reproducibility. For photoelectric and semiconductor applications, both the n-type and p-type semiconductor materials are required to form PN junctions. Therefore, there exists a need for a stable zinc oxide based p-type semiconductor material and related reproducible fabrication method.

BRIEF SUMMARY OF INVENTION

According to the issues described, the invention provides a p-type metal oxide semiconductor material, having a formula $Li_xZn_{x-1}O$, wherein the Li/Zn ratio is 0.0005 to 0.01.

The invention further discloses fabrication of the p-type metal oxide semiconductor material, comprising: providing a lithium salt and a zinc salt to be mixed in a solution; adding a chelating agent to the mixed solution to form a metal complex compound comprising lithium and zinc; and performing a heating process for the metal complex compound to form a p-type metal oxide semiconductor material powder, having a formula $Li_xZn_{x-1}O$, wherein the Li/Zn ratio is 0.0005 to 0.01.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following descriptions are of the contemplated mode of carrying out the invention. This descriptions are made for the purpose of illustrating the general principles of the invention and should not be taken in a limiting sense, not for limiting the invention.

Figure 1A:
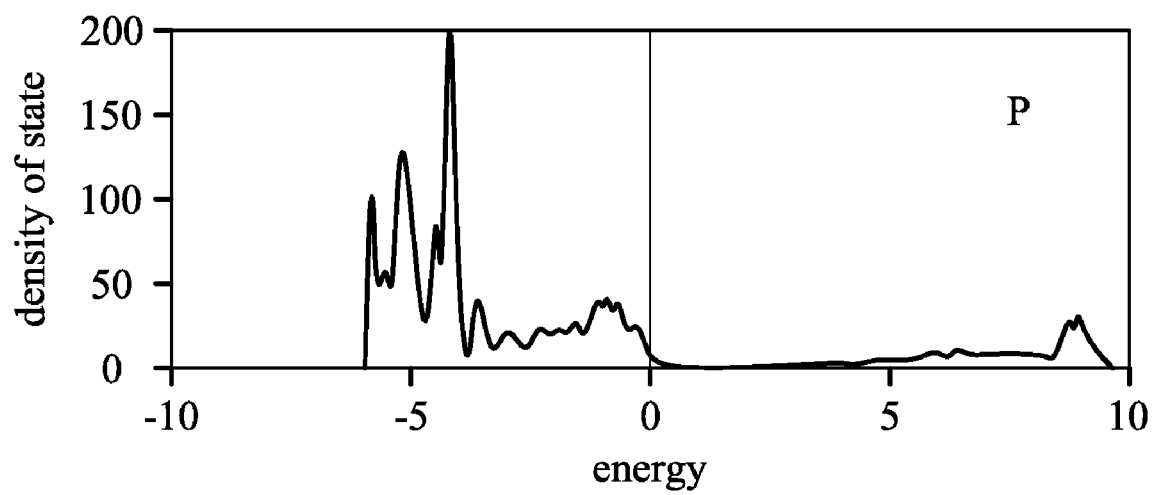
FIG. 1A shows a diagram with density of state (DOS) as a function of energy under the mode wherein one zinc atom of thirty two zinc oxide atoms is replaced by a lithium atom.
Figure 1B:
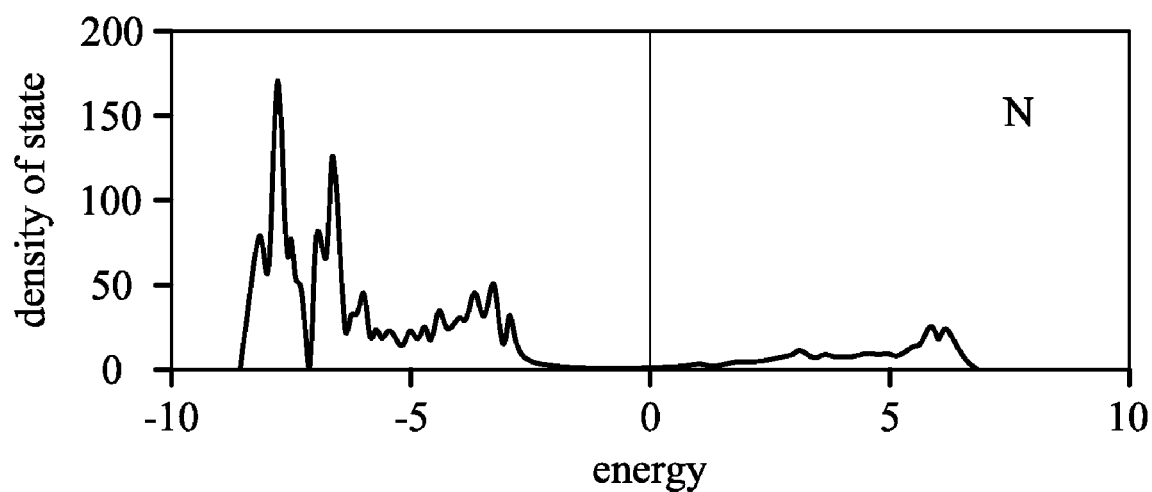
FIG. 1B shows a diagram with density of state (DOS) as a function of energy under the mode wherein a lithium atom is inserted into thirty two zinc oxide atoms.
Figure 1C:
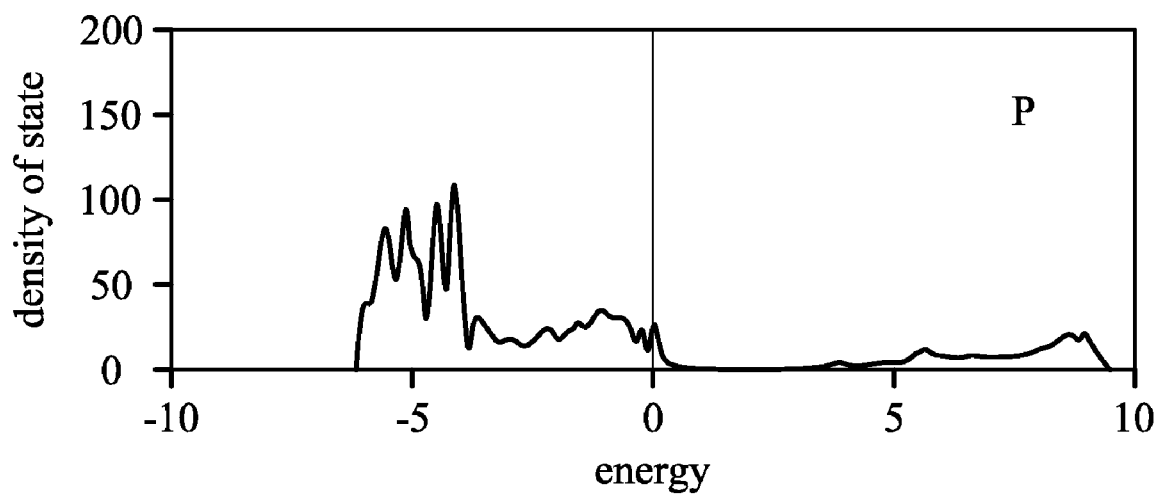
FIG. 1C shows a diagram with density of state (DOS) as a function of energy under the mode wherein a lithium atom is inserted into thirty two zinc oxide atoms and a zinc atom vacancy is formed.
Figure 1D:
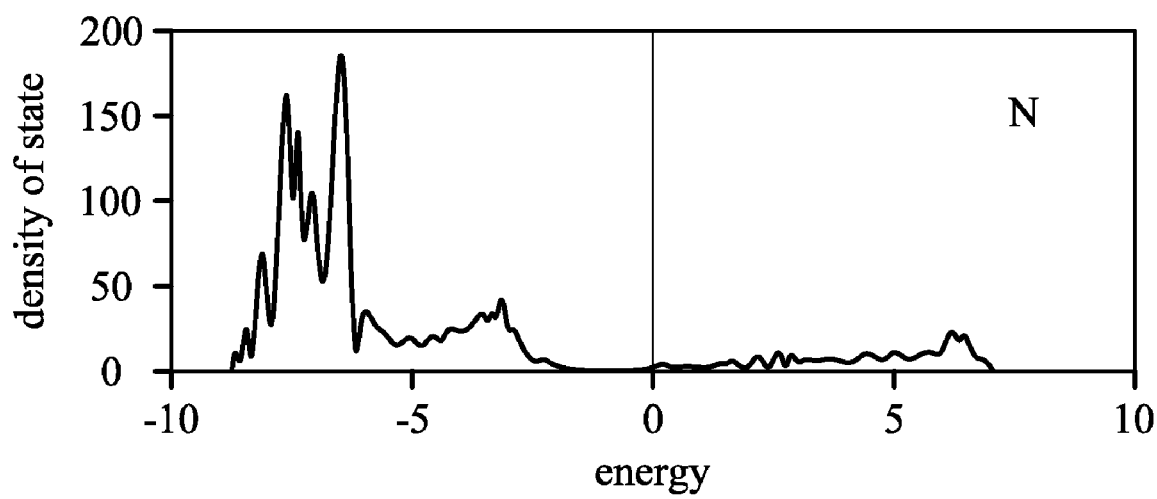
FIG. 1D shows a diagram with density of state (DOS) as a function of energy under the mode wherein a lithium atom is inserted into thirty two zinc oxide atoms and an oxide atom vacancy is formed.
Figure 2:
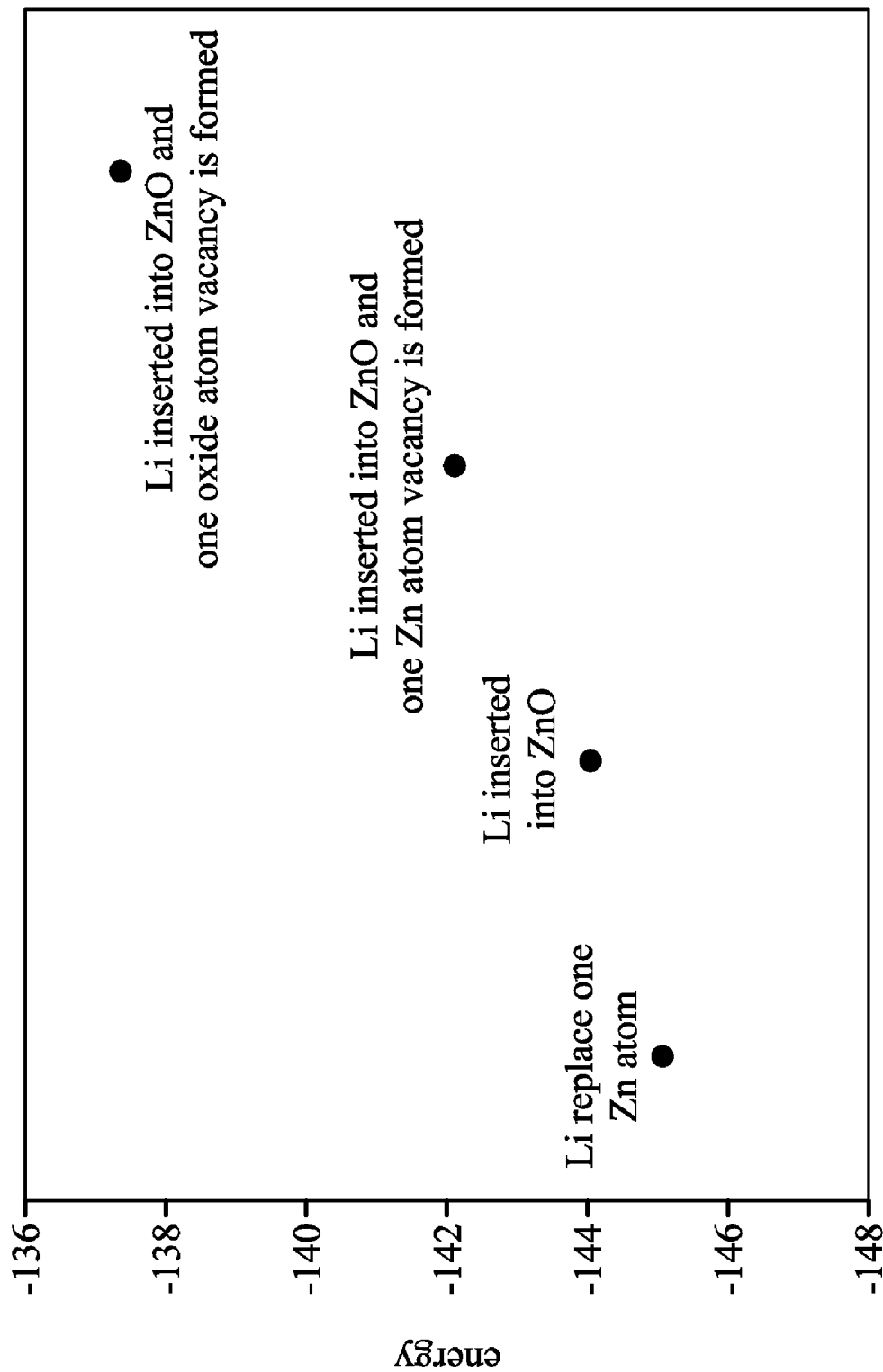
FIG. 2 shows Energy of the four mechanisms for forming a semiconductor material.

First, simulation was used to obtain a p-type semiconductor material by using zinc oxide doped with lithium. The simulation of zinc oxide doped with lithium of an embodiment of the invention is illustrated in accordance with FIGS. 1A~1C. Referring to FIG. 1A, which shows a diagram with density of state (DOS) as a function of energy under the mode wherein one zinc atom of thirty two zinc oxide atoms is replaced by a lithium atom, the femi level cuts the valance band, which shows that this mode obtains a p-type semiconductor material. Referring to FIG. 1B, which shows a diagram with density of state (DOS) as a function of energy under the mode wherein a lithium atom is inserted into thirty two zinc oxide atoms, the femi level cuts the conduction band, which shows that this mode obtains an n-type semiconductor material. Referring to FIG. 1C, which shows a diagram with density of state (DOS) as a function of energy under the mode wherein a lithium atom is inserted into thirty two zinc oxide atoms and a zinc atom vacancy is formed, the femi level cuts the valance band, which shows that this mode obtains a p-type semiconductor material. Referring to FIG. 1D, which shows a diagram with density of state (DOS) as a function of energy under the mode wherein a lithium atom is inserted into thirty two zinc oxide atoms and an oxide atom vacancy is formed, the femi level cuts the conduction band, which shows that this mode can obtain an n-type semiconductor material. Energy of the four mechanisms for forming a semiconductor material is described in accordance with FIG. 2. As shown in this figure, the mechanism wherein one zinc atom of thirty two zinc oxide atoms is replaced by a lithium atom presents the lowest energy.

The invention uses mild chemical reaction with precisely controlled compositions according to the simulation result described above to form a p-type semiconductor material with zinc oxide doped with lithium ($Li_xZn_{x-1}O$, wherein the Li/Zn ratio is 0.0005 to 0.01). The material can form a transparent film to be applied to transparent semiconductor devices and photoelectric devices. The example of forming a p-type semiconductor material with zinc oxide doped with lithium of the invention is described in the following paragraphs.

EXAMPLE 1

First, 0.005 mol of lithium salt $Li(NO_3)$ and 0.9995 mol of zinc salt $Zn(NO_3)_2 \cdot 6H_2O$ were added into a 10~50% $HNO_3$ solution. The acid solution was then added 1 mol tartaric acid to serve as a chelating agent and mixed at room temperature for one hour. It is noted that the chelating agent was combined with lithium and zinc to form a transitional-phase metal complex compound including at least two metal ion radicals after separating out mixed metal ions. Next, the solution was heated to 155° C. for evaporation to form a gel state, and following a drying step to oxide the transitional-phase metal complex compound to form a metal oxide precursor powder of chemical reaction was performed. Thereafter, a ceramic process comprising mold pressing, injecting, cold isostatic pressing (CIP) and slip casting, etc, was performed and then an ore-sintering and a mechanical manufacturing process was performed to make the powder form a substrate or a target.

EXAMPLE 2

First, 0.001 mol of lithium salt $Li(NO_3)$ and 0.999 mol of zinc salt $Zn(NO_3)_2.6H_2O$ were added into a 10~50% $HNO_3$ solution. The acid solution was then added 1 mol tartaric acid to serve as a chelating agent and mixed at room temperature for one hour. The chelating agent was combined with lithium and zinc to form a transitional-phase metal complex compound after separating out mixed metal ions. Next, the solution was heated to 155° C. for evaporation to form a gel state, and following a drying step to oxide the transitional-phase metal complex compound to form a metal oxide precursor powder of chemical reaction was performed. Thereafter, a ceramic process was performed and then an ore-sintering and a mechanical manufacturing process was performed to make the powder form a substrate or a target.

EXAMPLE 3

First, 0.002 mol of lithium salt $Li(NO_3)$ and 0.998 mol of zinc salt $Zn(NO_3)_2.6H_2O$ were added into a 10~50% $HNO_3$ solution. The acid solution was then added 1 mol tartaric acid to serve as a chelating agent and mixed at room temperature for one hour. The chelating agent was combined with lithium and zinc to form a transitional-phase metal complex compound after separating out mixed metal ions. Next, the solution was heated to 155° C. for evaporation to form a gel state, and following a drying step to oxide the transitional-phase metal complex compound to form a metal oxide precursor powder of chemical reaction was performed. Thereafter, a ceramic process was performed and then an ore-sintering and a mechanical manufacturing process was performed to make the powder form a substrate or a target.

EXAMPLE 4

First, 0.003 mol of lithium salt $Li(NO_3)$ and 0.997 mol of zinc salt $Zn(NO_3)_2.6H_2O$ were added into a 10~50% $HNO_3$ solution. The acid solution was then added 1 mol tartaric acid to serve as a chelating agent and mixed at room temperature for one hour. The chelating agent was combined with lithium and zinc to form a transitional-phase metal complex compound after separating out mixed metal ions. Next, the solution was heated to 155° C. for evaporation to form a gel state, and following a drying step to oxide the transitional-phase metal complex compound to form a metal oxide precursor powder of chemical reaction was performed. Thereafter, a ceramic process was performed and then an ore-sintering and a mechanical manufacturing process was performed to make the powder form a substrate or a target.

EXAMPLE 5

First, 0.004 mol of lithium salt $Li(NO_3)$ and 0.996 mol of zinc salt $Zn(NO_3)_2.6H_2O$ were added into a 10~50% $HNO_3$ solution. The acid solution was then added 1 mol tartaric acid to serve as a chelating agent and mixed at room temperature for one hour. The chelating agent was combined with lithium and zinc to form a transitional-phase metal complex compound after separating out mixed metal ions. Next, the solution was heated to 155° C. for evaporation to form a gel state, and following a drying step to oxide the transitional-phase metal complex compound to form a metal oxide precursor powder of chemical reaction was performed. Thereafter, a ceramic process was performed and then an ore-sintering and a mechanical manufacturing process was performed to make the powder form a substrate or a target.

EXAMPLE 6

First, 0.005 mol of lithium salt $Li(NO_3)$ and 0.995 mol of zinc salt $Zn(NO_3)_2.6H_2O$ were added into a 10~50% $HNO_3$ solution. The acid solution was then added 1 mol tartaric acid to serve as a chelating agent and mixed at room temperature for one hour. The chelating agent was combined with lithium and zinc to form a transitional-phase metal complex compound after separating out mixed metal ions. Next, the solution was heated to 155° C. for evaporation to form a gel state, and following a drying step to oxide the transitional-phase metal complex compound to form a metal oxide precursor powder of chemical reaction was performed. Thereafter, a ceramic process was performed and then an ore-sintering and a mechanical manufacturing process was performed to make the powder form a substrate or a target.

EXAMPLE 7

First, 0.01 mol of lithium salt $Li(NO_3)$ and 0.99 mol of zinc salt $Zn(NO_3)_2.6H_2O$ were added into a 10~50% $HNO_3$ solution. The acid solution was then added 1 mol tartaric acid to serve as a chelating agent and mixed at room temperature for one hour. The chelating agent was combined with lithium and zinc to form a transitional-phase metal complex compound after separating out mixed metal ions. Next, the solution was heated to 155° C. for evaporation to form a gel state, and following a drying step to oxide the transitional-phase metal complex compound to form a metal oxide precursor powder of chemical reaction was performed. Thereafter, a ceramic process was performed and then an ore-sintering and a mechanical manufacturing process was performed to make the powder form a substrate or a target.

Note that the mild chemical reaction described, forms a metal complex compound first, and then the metal complex compound oxides to form a metal oxide which assumes that the chemical reaction wherein lithium replaces one zinc atom was performed. According to the simulation in FIG. 1A and the measurement result shown in Table 1, the semiconductor material of the embodiment is assumed to be a p-type semiconductor material.

TABLE 1

| Example | Li/Zn Mole ratio | Resistivity ($\Omega \cdot cm$) | Mobility ($cm^2 V^{-1} s^{-1}$) | Carrier density ($cm^{-3}$) | Carrier type |
| --- | --- | --- | --- | --- | --- |
| 1 | 0.05% | 57 | 22 | $3.1 \times 10^{18}$ | p |
| 2 | 0.1% | 1.3 | 27 | $7.3 \times 10^{19}$ | p |
| 3 | 0.2% | $8 \times 10^{-2}$ | 35 | $3.02 \times 10^{20}$ | p |
| 4 | 0.3% | $2.7 \times 10^{-1}$ | 28 | $3.2 \times 10^{20}$ | p |
| 5 | 0.4% | — | — | — | — |
| 6 | 0.5% | — | — | — | — |
| 7 | 1% | 540 | 1.6 | $5.8 \times 10^{17}$ | p |

According to the Table 1 above, when Li/Zn mole ratio of $Li_xZn_{x-1}O$ is 0.0005 to 0.01, the semiconductor material is measured to have major carriers (holes) more than $10^{16}/cm^{-3}$. This measurement result matches the simulation that the semiconductor material formed in the embodiment to be p type. It is noted that when Li/Zn mole ratio is between 0.2%~0.3%, the semiconductor material has greater major carrier (hole) content, faster carrier mobility and lower resistivity. That is, a preferable p-type semiconductor material is obtained within the Li/Zn mole ratio range.

According to the simulation and experiment results described, the invention uses a mild chemical reaction and precise control of compositions to obtain a p type semiconductor material with lithium doped zinc oxide ($Li_xZn_{x-1}O$, wherein the Li/Zn ratio is 0.0005 to 0.01) to be applied for photoelectric and semiconductor devices.

While the invention has been described by way of example and in terms of the preferred embodiments, it is to be understood that the invention is not limited to the disclosed embodiments. For example, the lithium salt of the invention can further be lithium sulfate, lithium chloride, lithium hydroxide or other salts, the zinc salt of the invention can further be zinc sulfate, zinc chloride, zinc hydroxide or other salts, and the chelating agent can further be citric acid, ammonic acid, etc. Additionally, the invention is intended to cover various modifications and similar arrangements (as would be apparent to those skilled in the art). For example, the invention further comprises a thin film formed by evaporation using the substrate or target fabricated above. Therefore, the scope of the appended claims should be accorded the broadest interpretation so as to encompass all such modifications and similar arrangements.

What is claimed is:

1. A fabrication method for a p-type metal oxide semiconductor material, comprising:

providing a lithium salt and a zinc salt to be mixed in a solution, wherein the solution is added a chelating agent to form a metal complex compound comprising lithium and zinc; and performing a heating process for the metal complex compound to form a p-type metal oxide semiconductor material powder, having a formula:

$Li_xZn_{1-x}O$, wherein the Li/Zn ratio is 0.0005 to 0.01.

2. The fabrication method for a p-type metal oxide semiconductor material as claimed in claim 1, wherein the lithium salt is lithium sulfate, lithium chloride or lithium hydroxide.

3. The fabrication method for a p-type metal oxide semiconductor material as claimed in claim 1, wherein the zinc salt is zinc citrate, $Zn(NO_3)_2\cdot 6H_2O$, zinc sulfate, zinc chloride or zinc hydroxide.

4. The fabrication method for a p-type metal oxide semiconductor material as claimed in claim 1, wherein the chelating agent is tartaric acid, citric acid or ammonic acid.

5. The fabrication method for a p-type metal oxide semiconductor material as claimed in claim 1, further comprising performing a ceramic process to make the p-type metal oxide semiconductor material powder form a substrate or target.

6. The fabrication method for a p-type metal oxide semiconductor material as claimed in claim 5, wherein the ceramic process comprises mold pressing, injecting, cold isostatic pressing (CIP) or slip casting.

* * * * *